(12) United States Patent
Wanzakhade

(10) Patent No.: US 7,403,407 B1
(45) Date of Patent: Jul. 22, 2008

(54) MAGNITUDE COMPARATOR CIRCUIT FOR CONTENT ADDRESSABLE MEMORY WITH PROGRAMMABLE PRIORITY SELECTION

(75) Inventor: Sanjay M. Wanzakhade, San Jose, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 1567 days.

(21) Appl. No.: 10/266,953

(22) Filed: Oct. 8, 2002

Related U.S. Application Data

(60) Provisional application No. 60/343,973, filed on Dec. 27, 2001.

(51) Int. Cl.
*G11C 15/00* (2006.01)

(52) U.S. Cl. ............... 365/49; 365/189.06; 365/189.07

(58) Field of Classification Search ............... 365/49, 365/189.06, 189.07
See application file for complete search history.

(56) References Cited

U.S. PATENT DOCUMENTS

| | | | | |
|---|---|---|---|---|
| 5,400,007 | A | * | 3/1995 | McClure ............... 340/146.2 |
| 5,602,550 | A | | 2/1997 | Stein ..................... 341/76 |
| 5,703,803 | A | * | 12/1997 | Shadan et al. ............ 365/49 |
| 6,650,561 | B2 | * | 11/2003 | Batson et al. ............ 365/49 |
| 2004/0042241 | A1 | * | 3/2004 | McKenzie et al. ........ 365/49 |

* cited by examiner

*Primary Examiner*—Richard T. Elms
*Assistant Examiner*—Hien N Nguyen
(74) *Attorney, Agent, or Firm*—Haverstock & Owens, LLP

(57) ABSTRACT

A magnitude comparator circuit can include a bitwise comparison section that includes two passgates for each bit of two values that are compared to one another. The passgates can be enabled according to corresponding bit values of the two values.

20 Claims, 7 Drawing Sheets

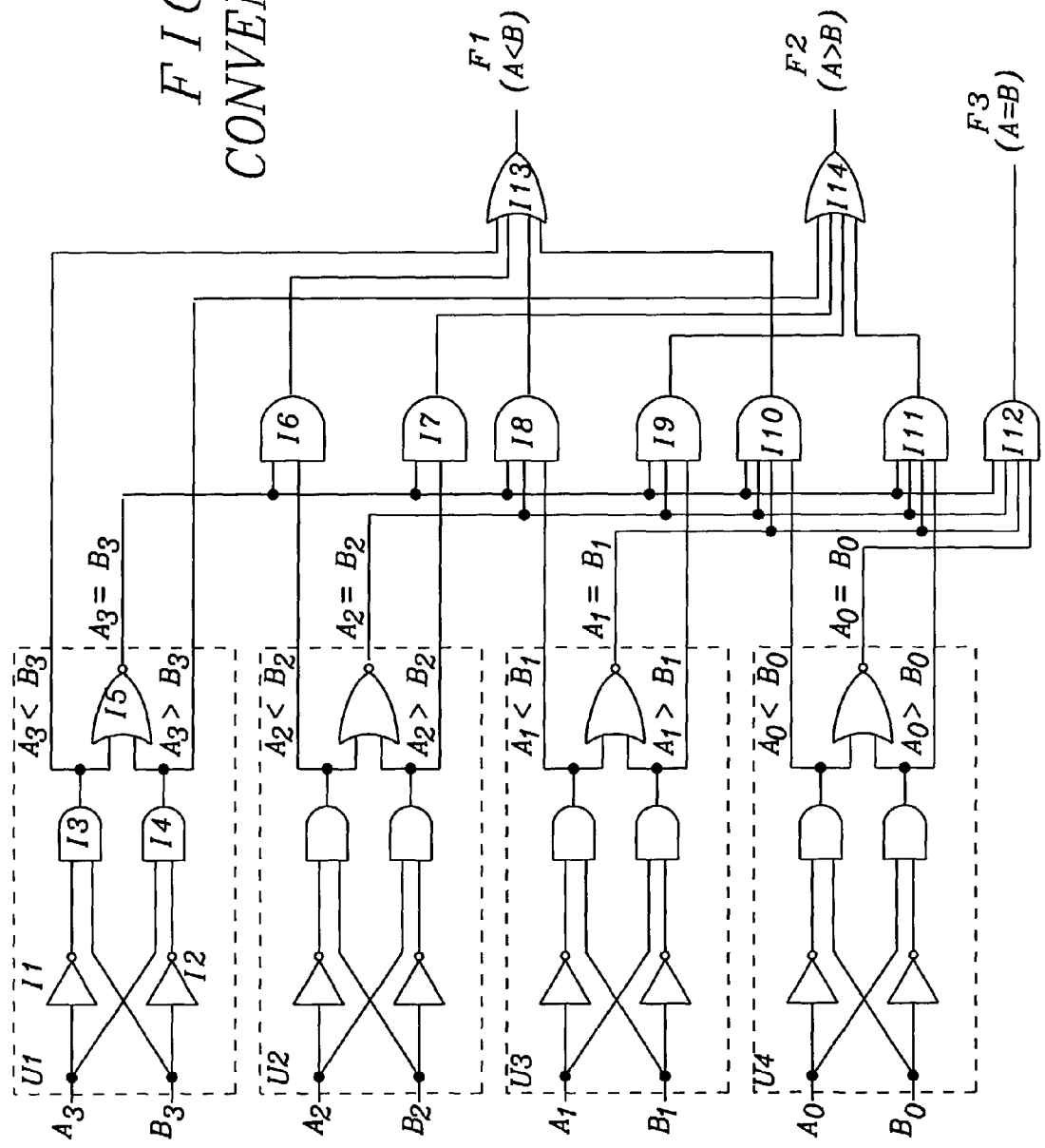
FIG. 6
CONVENTIONAL

MAGNITUDE COMPARATOR CIRCUIT FOR CONTENT ADDRESSABLE MEMORY WITH PROGRAMMABLE PRIORITY SELECTION

CROSS-REFERENCE TO RELATED APPLICATION

The present application is related to and claims benefit of priority of the filing date of U.S. Provisional Patent Application entitled "Search Engine Architecture and Method", assigned Ser. No. 60/343,973, filed Dec. 27, 2001, and herein incorporated by reference.

BACKGROUND OF THE INVENTION

1. Field of the Invention

This invention relates to content addressable memories. More particularly, this invention relates to circuits and methods for determination of the priority of the selection of the index address based on programmed priority.

2. Description of Related Art

As is known in the art, a content addressable memory (CAM) has comparand data supplied to the memory and the memory returns an address if a corresponding match is found. The entire CAM can be searched in a single clock cycle and if a match is found, the address returned may be used to retrieve data associated with the search string. Such associated data is typically stored in a separate, discrete memory in a location specified by the result of the CAM search.

The structure and function of the CAM permits the determination of the best routing of messages on a network such as an intranet or the Internet. A router employs a CAM to quickly determine the location of the fast route for a message rather than a slower software based search through a standard memory array to determine the path.

Generally, when a comparand has multiple matches to locations within the CAM, a priority encoder selects the address or index of the location with the matching content and having the greatest priority dependent on the priority scheme implemented within the CAM. Generally the priority scheme used is fixed and not easily changeable in CAMs as manufactured at the present time.

Magnitude comparators are well known in the conventional art for determining the relative magnitude of two binary numbers. A general form of a magnitude comparator compares a group of most significant bits of the two binary numbers for equality and the next less significant bits if they are less than or greater than one another. All the groupings are then logically OR'ed to determine the relative magnitudes of the two binary numbers. The equality of the two binary numbers is determined by performing an exclusive NOR (XNOR) for each bit pair of the two binary numbers. The results of the XNOR's of each bit pair are then combined with a logical AND. Refer to FIG. 6 for a discussion of an example of a conventional structure of a magnitude comparator as presented in *Digital Design*, Mano, Prentice Hall PTR, Published 1991, pp. 163-165. Each of the exclusive NOR's U1, U2, U3, and U4 have a pair of bits (A3, B3), (A2, B2), (A1, B1), (A0, B0), respectively representing the digits of each of the two binary numbers connected as inputs. The exclusive NOR function as is known in the art is the function for equivalence in Boolean algebra and therefore each of the XNOR's U1, U2, U3, and U4 provides a signal indicating the equality of each of the pairs of bits (A3, B3), (A2, B2), (A1, B1), (A0, B0). The XNOR's U1, U2, U3, and U4 as is further known in the art has the Boolean function:

$$A_n * B_n + \overline{A_n} * \overline{B_n}$$

The XNOR's U1, U2, U3, and U4 each have two inverters I1 and I2 which provide the complement for each of the pairs of bits (A3, B3), (A2, B2), (A1, B1), (A0, B0). The AND gate I3 has the complement of the bit An and the bit Bn as inputs and the AND gate I4 has the bit An and the complement of the bit Bn as inputs. The output of the AND gate I3 provides the inequality An<Bn and the output of the AND gate I4 provides the inequality An>Bn. The inputs of the NOR gate I5 are the outputs of the AND gates I3 and I4. The output of the NOR gate I5 is the indication of the equality of the input bits (An, Bn).

The AND gates I6, I8, I10 combine the equality of the more significant bits and the inequality indicating An<Bn of the lesser significant bit. The outputs of the AND gates I6, I8, I10 are combined by the OR gate I13 to generate the inequality A<B of the two binary numbers.

The AND gates I7, I9, I11 combine the equality of the more significant bits and the inequality indicating An>Bn of the lesser significant bits. The outputs of the AND gates I7, I9, I11 are combined by the OR gate I14 to generate the inequality A>B of the two binary numbers.

The AND gate I12 has the equality outputs of XNOR's U1, U2, U3, and U4. Since all of the pairs of bits (A3, B3), (A2, B2), (A1, BI), (A0, B0) must be equal for the binary numbers to be equal, the output of the AND gate I12 provides the indication that all the pairs of bits (A3, B3), (A2, B2), (A1, B1), (A0, B0) are equal and therefore the indication of the equality of the two binary numbers.

The outputs F1, F2, F3 of the magnitude comparator provide individual or "one hot" indication of the relative magnitudes of the two binary numbers A and B. Having this conventional structure forces an implementation of the circuit to occupy excess area within an integrated circuit. While the structure of the magnitude comparator as shown is essentially a canonical structure, an actual circuit implementation would require more circuits than shown to implement the function. It is well known in the conventional art that basic function of a CMOS logic circuit is an inverter and that more complex functions formed are normally NAND gates or NOR gates. This requires use of inverted logic and thus extra inverters to accomplish a simple AND or OR function.

The implementation of an inequality function as an exclusive OR function using a passgate or transmission gate is explained in Mano pages 430-433 and shown in FIG. 7. The two input bits A and B are connected respectively to the inverter circuits I1 and I2 to provide the complements for the two input bits A and B. In this implementation, the control of the transmission gates TG1 and TG2 is determined by the state of the input bit A. The state of the input bit B or its complement at the output of the inverter I2 is the connected to transfer through the pass-gates TG1 or TG2 as controlled by the state of the input bit A. It is shown in Table 1 that the output F is the exclusive OR (XOR) of the two input bits A and B.

TABLE 1

| A | B | TG1 | TG2 | F |
|---|---|---|---|---|
| 0 | 0 | CLOSED | OPEN | 0 |
| 0 | 1 | CLOSED | OPEN | 1 |
| 1 | 0 | OPEN | CLOSED | 1 |
| 1 | 1 | OPEN | CLOSED | 0 |

It is well known in the conventional art that the exclusive OR as shown in Table 1 is a negative function of the XNOR or an equality function. Thus the function F of Table 1 can be represented as:

$$F=(A \neq B)=\overline{(A=B)}$$

U.S. Pat. No. 5,602,550 (Stein) describes a method and apparatus for compressing a data vector of a predetermined number of data points. The apparatus includes a memory for storing the compressed data vector, a first comparator for determining a largest and smallest data point of the data vector and a second comparator for comparing the largest and smallest data point and when they are equal, causing a first data point of the data vector to be stored in the memory as the compressed data vector. The apparatus also includes a first processor for determining a data field width necessary to uniquely describe a largest relative magnitude data point and a second processor for storing the data points of the data vector as the compressed vector in data fields of memory of the data field width. The apparatus also includes a comparator and register for creating a difference vector of difference values of adjacent data points of the data vector, a first processor for determining a data field width necessary to uniquely describe a largest magnitude difference value of the difference vector, and a second processor for storing the difference points of the difference vector as the compressed vector in data fields of the memory of the determined field width along with a magnitude and sign of the first data point of the data vector.

SUMMARY OF THE INVENTION

An object of this invention is to provide a content addressable memory having a changeable or programmable priority for the selection of an index or location having contents that match a key value input of the content addressable memory.

Another object of this invention is to provide a programmable priority multiplexing circuit for a content addressable memory to select one index or location having contents that match the key value input of the content addressable memory dependant upon a programmable or changeable priority.

Further, another object of this invention is to provide a magnitude comparator to compare the index or location values of the content addressable memory that match the key value input and to provide an indication of the relative value of the index or location values.

To accomplish at least one of these objects' and other objects, a content addressable memory device has plurality of sub-units having arrays of content addressable memory cells. The plurality of sub-units are connected to receive an externally transmitted key value containing a comparand and each unit compares the comparand to stored data values of the content addressable memory cells and may provide an index value signal indicating a location within each sub-unit where the contents of the locations match the comparand. The content addressable memory further has at least one programmable priority multiplexing circuit. Each programmable priority multiplexing circuit is connected to receive a plurality of index value signals and a changeable priority signal. The changeable priority signal indicates a priority of selection of the plurality of index value signals and from the contents of the index value signals, provides an output having one of the plurality of index value signals. The changeable priority signal may be a portion of the key value transmitted to the content addressable memory for the search of the contents and may be set by a user of the content addressable memory device.

The programmable priority multiplexing circuit includes a magnitude comparator. The magnitude comparator is connected to receive the plurality of index value signals or soft priority values from the plurality of index value signals provides a magnitude signal indicating a relative magnitude of each of the plurality of index value signals.

The magnitude comparator circuit has a bit comparison circuit. The bit comparison circuit determines equality for each bit of the two binary numbers and if not equal, the relative magnitude for each bit of the two binary numbers. The bit comparison section includes two passgates for each bit of the two binary numbers that are compared. The passgates are enabled according to corresponding bit values of the two binary numbers to determine equality of the corresponding bits to generate a bit equality signal for each bit of the two binary numbers. The bit comparison section further has a first logic circuit for determining the relative magnitude of the bits of the two binary numbers and for providing a bit magnitude signal indicative of the relative magnitude of the binary digits. The bit comparison circuit further has a bit complementing circuit for each bit of the two binary numbers to provide a complement for each bit of the two binary numbers. The bit complementing circuit is connected to the two passgates to provide the complement for each bit to the two pass-gates.

The magnitude comparator circuit further contains an equality circuit and a relative magnitude circuit. The equality circuit is in communication with the bit comparison section and receives the bit equality signal of each bit of the two binary numbers to generate a number equality signal, which, when active, indicates the equality of the two binary numbers. The relative magnitude circuit is in communication with the bit comparison section to receive the bit equality signals and the bit magnitude signals for all bits of the two binary numbers, to logically combine the bit equality signals and the bit magnitude signals to determine the relative magnitude of the two binary numbers.

The programmable priority multiplexing circuit further includes an index selector and a multiplexer. The index selector is connected to receive the changeable priority signal and the magnitude signal. The index selector provides an index signal, which is generated based on the changeable priority signal indicating which one of the plurality index value signals matches the priority. The multiplexer is connected to receive the plurality of index value signals and the index signal. The multiplexer provides the output having the one of the plurality of index value signals, dependent upon the index signal determined from the priority signal.

BRIEF DESCRIPTION OF THE DRAWINGS

FIG. 6 is schematic diagram of a magnitude comparator of the conventional art.

DETAILED DESCRIPTION OF THE EMBODIMENTS

Figure 1:
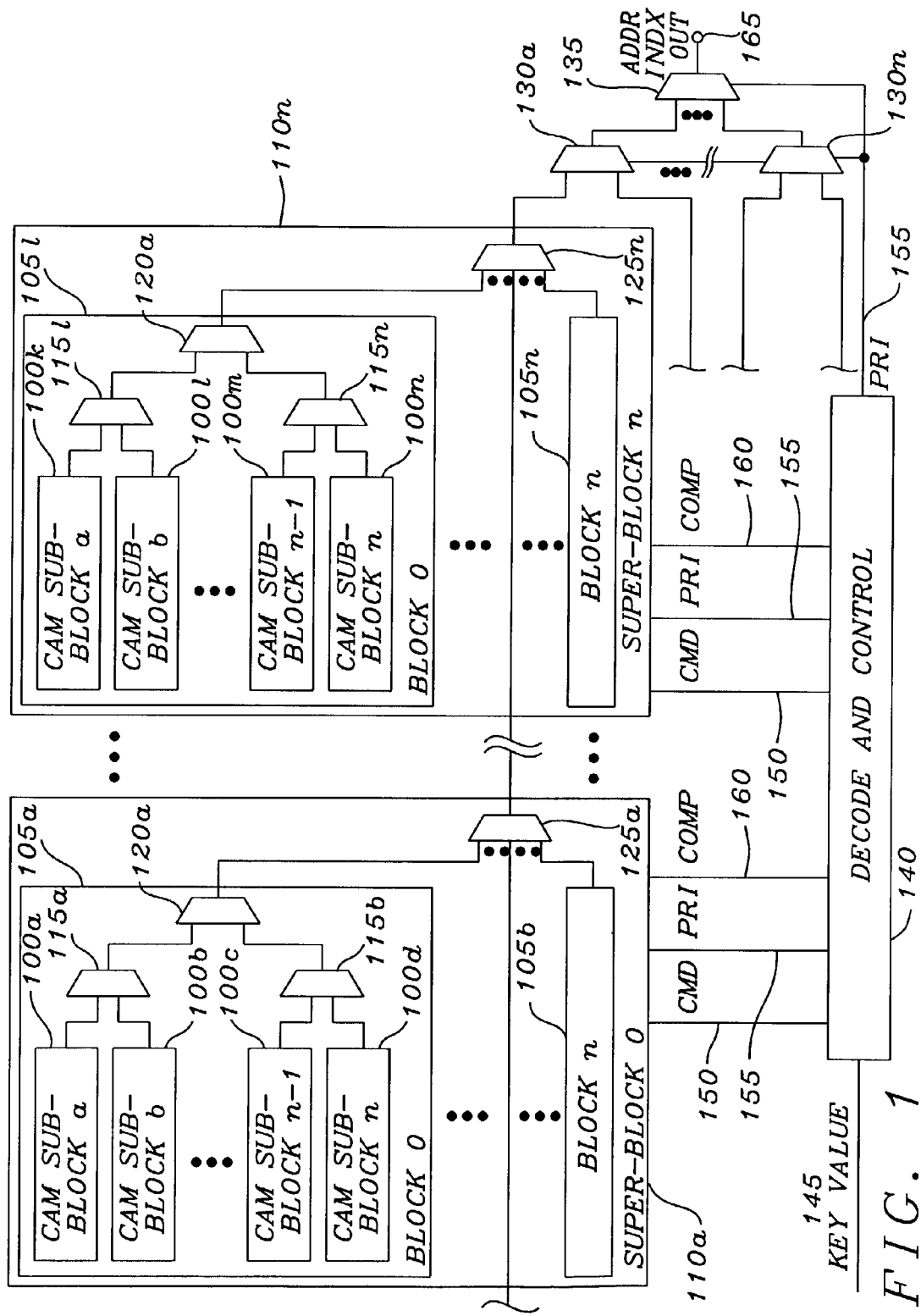
FIG. 1 is a block diagram of a content addressable memory according to embodiment of this invention.

Refer now to FIG. 1 for an overview of the content addressable memory (CAM) of this invention. The content addressable memory is formed of small sub-block of ternary CAM cells 100a, ..., 100n arranged in groups of blocks 105a, ..., 105n. Groups of the blocks 105a, ..., 105n of sub-blocks of ternary CAM cells 100a, ..., 1001n are further arranged in super-blocks I10a, ..., I10n. To perform a search within the CAM the key value 145 is applied to the decode and control circuitry 140. The decode and control circuitry 140 decodes and separates the key value 145 into the command and comparand that is to be applied through each super-block I10a, ..., I10n to each block 105a, ..., 105n and then to each sub-block 100a, ..., 100n. The priority portion 155 of the key value 145 is applied through the super-block I10a, ..., I10n to each block 105a, ..., 105n and then to each programmable priority multiplexing circuit I15a, ..., I15n, I20a, ..., I20n, I25a, ..., I25n, I30a, ..., I30n, I35. In the preferred embodiment of the CAM of this invention, the sub-blocks 100a, ..., 100n have a fixed priority as designed within the fundamental circuitry. The programmable priority multiplexing circuit of this invention is thus not included within the basic sub-block structure 100a, ..., 100n. However, it is in keeping with the intent of this invention that the programmable priority multiplexing circuit may be incorporated with or within the basic sub-block structure 100a, ..., 100n.

As is known in the art, the comparand is compared with the contents of each CAM array cell of each of the sub-blocks 100a, ..., 100n of CAM arrays. Whenever there is a match of the comparand with any of the contents of the CAM array cells, an index value signal indicating the location of the match is generated by the CAM array. If there are multiple matches within a single sub-block 100a, ..., 100n, a priority encoder within the sub-block 100a, ..., 100n determines which of the index value signals is to be transferred from the sub-block 100a, ..., 100n. The index value signal having the highest priority is transferred from pairs of the sub-blocks 100a, ..., 100n to one of the programmable priority multiplexing circuits I15a, ..., I15n. Based on the priority 155 as embedded in the key value 145 one of the index value signals from a pair of sub-blocks 100a, 100n is chosen to be passed to a programmable priority multiplexing circuit I20a, ..., I20n. The programmable priority multiplexing circuit I20a, ..., I20n is shown as receiving multiple index value signals, however, the basic structure of the programmable priority multiplexing circuit I20a, ..., I20n determines the index value signal having the highest priority in a pair-wise fashion incorporating circuitry that may be identical to the programmable priority multiplexing circuits I15a, ..., I15n. The winning index value signal or the signal having the highest priority for each block is transferred from the programmable priority multiplexing circuits I20a, ..., I20n to the programmable priority multiplexing circuit I25a, ..., I25n to determine the winning index value signal for each of the super blocks I10a, 100n. Then the winning index value signals from each super block I10a, ..., I10n is transferred to the programmable priority multiplexing circuits I30a, ..., I30n, and I35 to determine the ultimate winning address index value signal 165. The winning address index value signal 165 may then be transferred to an output terminal.

Figure 2:
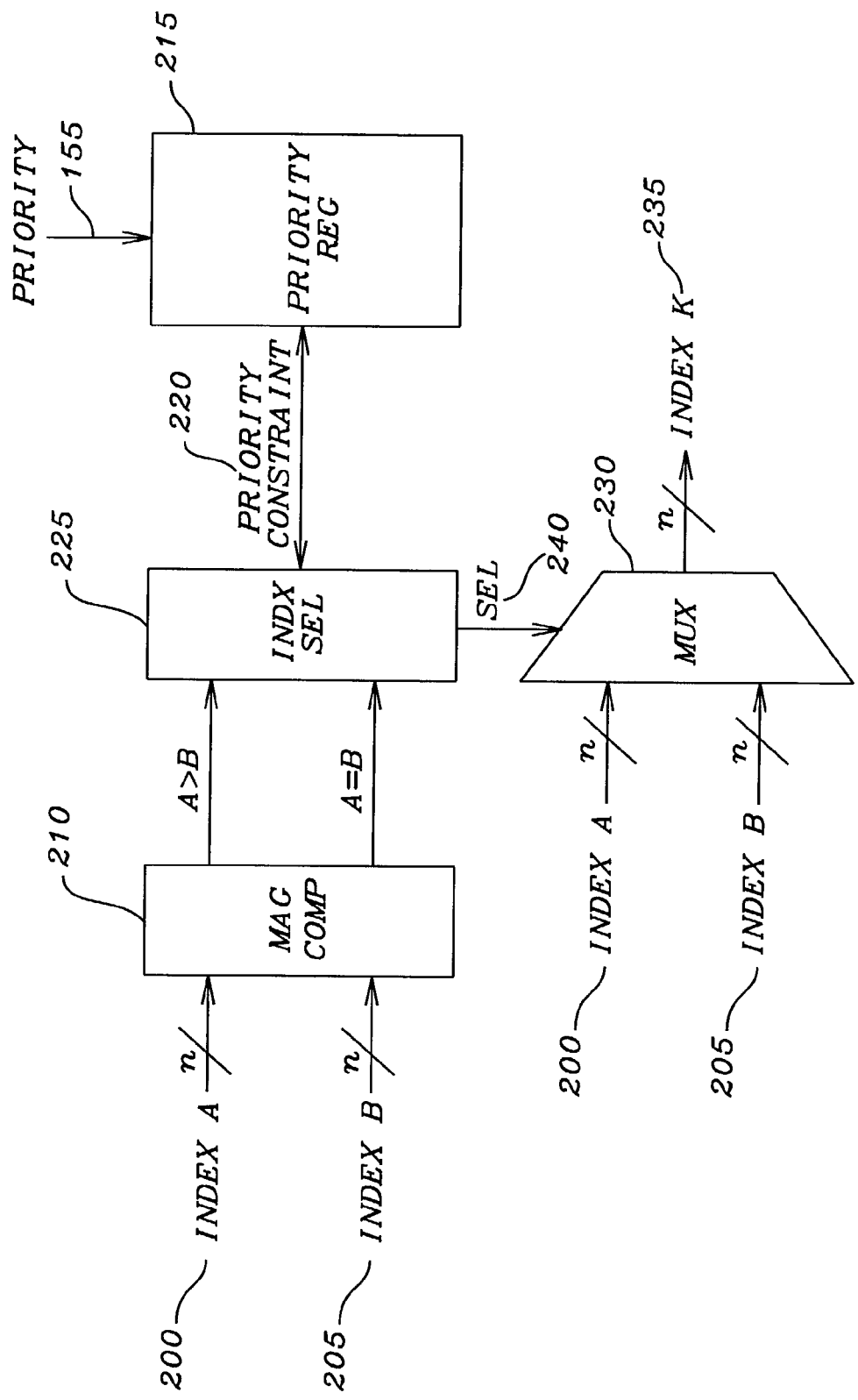
FIG. 2 block diagram of a programmable priority multiplexing circuit according to embodiments of this invention.

Refer now to FIG. 2 for an illustration of the fundamental structure of the programmable priority multiplexing circuits I15a, ..., I15n, I20a, I20n, I25a, ..., I25n, I30a, ..., I30n, I35 according to embodiments of this invention. The index values signals 200 and 205 are the inputs to the magnitude comparator 210. The magnitude comparator determines the relative magnitude of the two binary numbers of the index value signals 200 and 205 and provides two output signals indicating whether the index value signal 200 is equal to the index value signal 205 (A=B) or the index value signal 200 is greater than the index value signal 205 (A>B).

As discussed above, the magnitude comparator of the conventional art employs the "one hot" coding of three outputs and therefore the additional circuitry to determine whether the input signal A is less than the input signal B (A<B) of FIG. 6. In the magnitude comparator of this invention the magnitude comparator employs the two output signals (A=B) and (A>B) to determine whether the index value signal 200 is less than the index value signal 205 (A<B) by decoding the two output signals (A=B) and (A>B). If neither of the two output signals (A=B) nor (A>B) are active, then the index value signal 200 must be less than the index value signal 205 (A<B). Of course, the inverted values, $\overline{(A>B)}$ or $\overline{(A=B)}$, may also be formed as output signals of the magnitude comparator 210.

The index value signals 200 and 205 are inputs to the multiplexing circuit 230. The multiplexer chooses which of the index value signals 200 or 205 to transfer as the output index value signal 235 dependent on the select signal 240. The select signal is generated by the index selector 225 according to the values of the two output signals (A=B) and (A>B) of the magnitude comparator 210 and the priority signal 155. The priority signal 155 as developed from the key value 145 of FIG. 1 is retained in a priority register 215 for transfer to the index selector 225.

Figure 3:
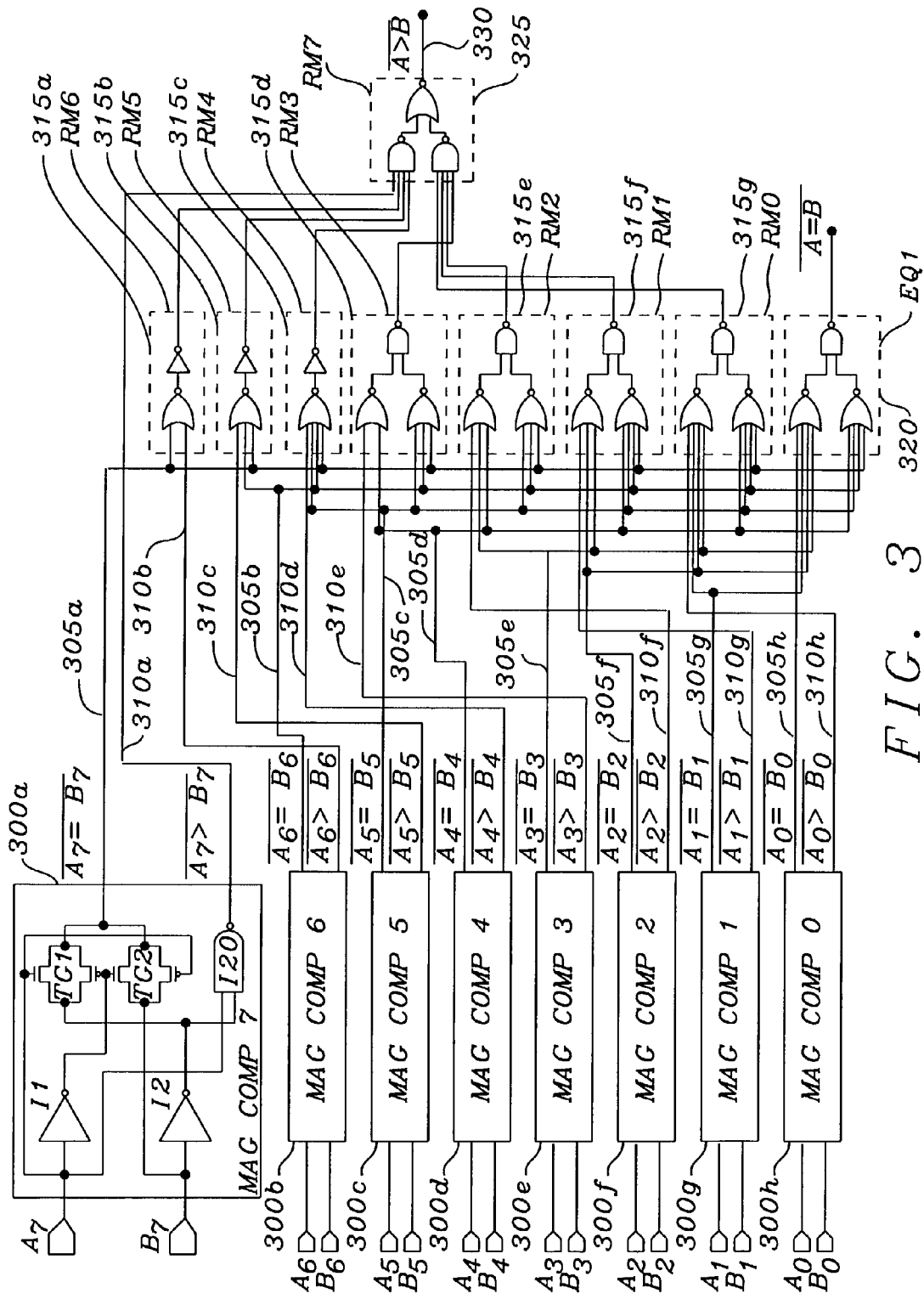
FIG. 3 is schematic diagram of a first embodiment of a magnitude comparator of this invention.

The first embodiment of the magnitude comparator of this invention is shown in FIG. 3. The magnitude comparator as shown in the preferred implementation of the first embodiment is for receiving two eight-bit index value signals (A and B) and comparing these eight-bit index value signals (A and B) to determine their relative magnitude. Each bit pair ($A_0$ and $B_0$), ..., ($A_7$ and $B_7$) of the index value signals (A and B) are connected to be received by the bit magnitude comparator circuits 300a, ..., 300h to determine the relative magnitude of each bit pair ($A_0$ and $B_0$), ..., ($A_7$ and $B_7$). The structure of each of the bit magnitude comparator circuits 300b, ..., 300h is the same as shown for the bit magnitude comparator circuit 300a. The bit magnitude comparator 300a has the bit pair ($A_7$ and $B_7$) of the index value signals (A and B) connected to be received respectively by the inverters I1 and I2. The inverters I1 and I2 provide the complement of the bit pair ($A_7$ and $B_7$). The bit $A_7$ and its complement are connected to the gate terminals of the transmission gates or passgates TG1 and TG2 to provide the control signals for the passgates TG1 and TG2. The bit $B_7$ and its complement are connected to the input terminals of the pass-gates TG1 and TG2 to be selectively transferred through the passgates TG1 and TG2. The output terminals of the passgates TG1 and TG2 are connected together to form the equality indicator output terminal 305a $\overline{(A_7=B_7)}$ of the magnitude comparator 300a. The bit $A_7$ and the complement of the bit $B_7$ are the input signals to the NAND gate I20. The NAND gate I20 logically combines the bit $A_7$ and the complement of the bit $B_7$ to form the relative magnitude signal $\overline{(A_7>B_7)}$ at the relative magnitude output terminal 310a.

The relative magnitude circuits 315a, ..., 315g are NOR and NAND or inverter circuits configured to determine the bit-wise relative magnitude of the binary numbers of the index value signals A and B according to the Boolean logic formula:

$$RM_i = \overline{(A_i > B_i)} * \prod_{i=1}^{n} \overline{(A_{i+1} = B_{i+1})} \qquad \text{Eq. 1}$$

where:

$RM_i$ is the relative magnitude of the ith bit of the binary numbers of the index value signals A and B.

is the bit being evaluated for the determining the relative magnitude of the binary numbers of the index value signals A and B.

n is the total number of bits present in the binary numbers of the index value signals A and B.

The outputs of the relative magnitude circuits 315a, ..., 315g and the relative magnitude signal $\overline{(A_7 > B_7)}$ for the most significant bit at the relative magnitude output terminal 310a are logically combined in the relative magnitude circuit 325 to determine the relative magnitude of the binary numbers A and B. The relative magnitude circuit is formed of two NAND gates whose outputs are connected to a NOR gate to form the relative magnitude output signal $\overline{(A > B)}$ at its output terminal 330.

Equality circuit 320 is formed of NOR gates having their outputs connected to a NAND gate. The equality circuit 320 determines if there is bit-wise equality of the binary numbers of the index value signals A and B according to the Boolean logic formula:

$$EQ = \prod_{i=1}^{n} \overline{(A_i = B_i)} \qquad \text{Eq. 2}$$

where:

EQ is the indication of the equality of the binary numbers of the index value signals A and B.

i is the bit being evaluated for the determining the equality of the binary numbers of the index value signals A and B.

n is the total number of bits present in the binary numbers of the index value signals A and B.

Figure 4:
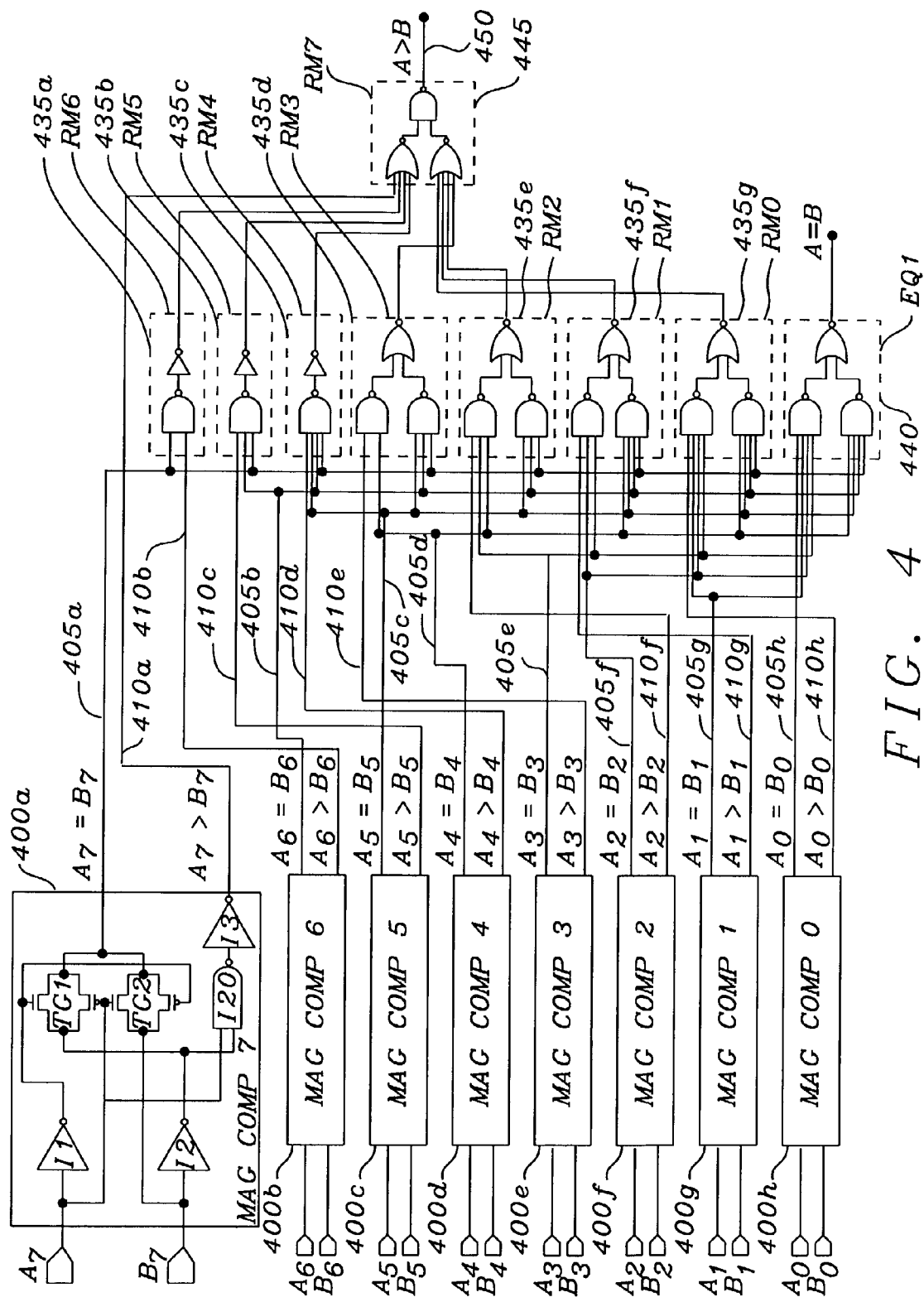
FIG. 4 is schematic diagram of a second embodiment of a magnitude comparator of this invention.

The second embodiment of the magnitude comparator of this invention is shown in FIG. 4. The magnitude comparator as shown in the preferred implementation of the second embodiment is for receiving two eight-bit index value signals (A and B) and comparing these eight-bit index value signals (A and B) to determine their relative magnitude. Each bit pair ($A_0$ and $B_0$), ..., ($A_7$ and $B_7$) of the index value signals (A and B) are connected to be received by the bit magnitude comparator circuits 400a, ..., 400h to determine the relative magnitude of each bit pair ($A_0$ and $B_0$), ..., ($A_7$ and $B_7$). The structure of each of the bit magnitude comparator circuits 400b, ..., 400h is the same as shown for the bit magnitude comparator circuit 400a. The bit magnitude comparator 400a has the bit pair ($A_7$ and $B_7$) of the index value signals (A and B) connected to be received respectively by the inverters I1 and I2. The inverters I1 and I2 provide the complement of the bit pair ($A_7$ and $B_7$). The bit $A_7$ and its complement are connected to the gate terminals of the transmission gates or passgates TG1 and TG2 to provide the control signals for the passgates TG1 and TG2. The bit $B_7$ and its complement are connected to the input terminals of the passgates TG1 and TG2 to be selectively transferred through the passgates TG1 and TG2. The output terminals of the passgates TG1 and TG2 are connected together to form the equality indicator output terminal 405a ($A_7 = B_7$) of the magnitude comparator 400a.

The bit $A_7$ and the complement of the bit $B_7$ are the input signals to the NAND gate I20. The NAND gate I20 and the inverter I3 logically combine the bit $A_7$ and the complement of the bit $B_7$ to form the relative magnitude signal ($A_7 > B_7$) at the relative magnitude output terminal 410a.

The relative magnitude circuits 435a, ..., 435g of the second embodiment are NAND and NOR or inverter circuits configured to determine the bit-wise relative magnitude of the binary numbers of the index value signals A and B according to the Boolean logic formula of Eq. 1.

The outputs of the relative magnitude circuits 435a, ..., 435g and the relative magnitude signal ($A_7 > B_7$) for the most significant bit at the relative magnitude output terminal 410a are logically combined in the relative magnitude circuit 445 to determine the relative magnitude of the binary numbers A and B. The relative magnitude circuit 445 is formed of two NOR gates whose outputs are connected to a NAND gate to form the relative magnitude output signal (A>B) at its output terminal 450.

Equality circuit 440 is formed of NAND gates having their outputs connected to a NOR gate. The equality circuit determines if there is bit-wise equality of the binary numbers of the index value signals A and B according to the Boolean logic formula Eq. 2.

The equality function (A=B), which is shown as NOR gates in the magnitude comparator of the conventional art of FIG. 6, is implemented as a transmission gate XNOR structure in bit magnitude comparator circuits 300a, ..., 300h of the first embodiment of this invention using existing inversion of signals in the relative magnitude circuit I20 (A>B) circuit for the complement of the input B. The structure of magnitude comparator of this invention differs from the magnitude comparator of the conventional art in that the bit magnitude comparator circuits 300a, ..., 300h of the first embodiment of this invention are faster than magnitude comparator of the conventional art, because it has only 6 gate delays, while magnitude comparator of the conventional art version has eight logic gate delays. The bit magnitude comparator circuits 300a, ..., 300h of the first embodiment of this invention employs a negative logic implementation to reduce the integrated circuit area required for the physical implementation, which because of the reduced area further increases speed. Since, the bit magnitude comparator circuits 300a, ..., 300h of the first embodiment this invention is used many times in the chip, the area reduction of this unit block is an important factor. As noted above, the outputs of magnitude comparator of the conventional art are "one hot". The third output can be derived by decoding the other two outputs. Therefore the bit magnitude comparator circuits 300a, ..., 300h has only two outputs $\overline{(A > B)}$ and $\overline{(A = B)}$ to further reduce the area of the integrated circuit further.

The equality (A=B) circuit of the bit magnitude comparator circuits 300a, ..., 300h of the first embodiment of this invention, which is implemented using transmission gates TG1 and TG2, works in parallel with the relative magnitude circuit (A>B) circuit, which makes the bit magnitude comparator circuits 300a, ..., 300h faster than magnitude comparator of the conventional art. The magnitude comparator of the conventional art has the equality circuit (A=B) in series with the relative magnitude circuit (A>B). Having the equality circuit (A=B) in parallel with relative magnitude circuit (A>B), is important in that relative magnitude signal (A>B) is more timing critical in terms of using it for decision making by the logic receiving the relative magnitude signal (A>B). It should be noted that the worst-case. delay is through the least significant bit (A0 and B0), which generate (A0>B0) logic, and are waiting for all the equality results from (A7=B7), ..., (A1=B1), to complete. Making the equality function (A=B) in parallel with the relative magnitude function (A>B), improved the performance of this critical path.

Figure 5:
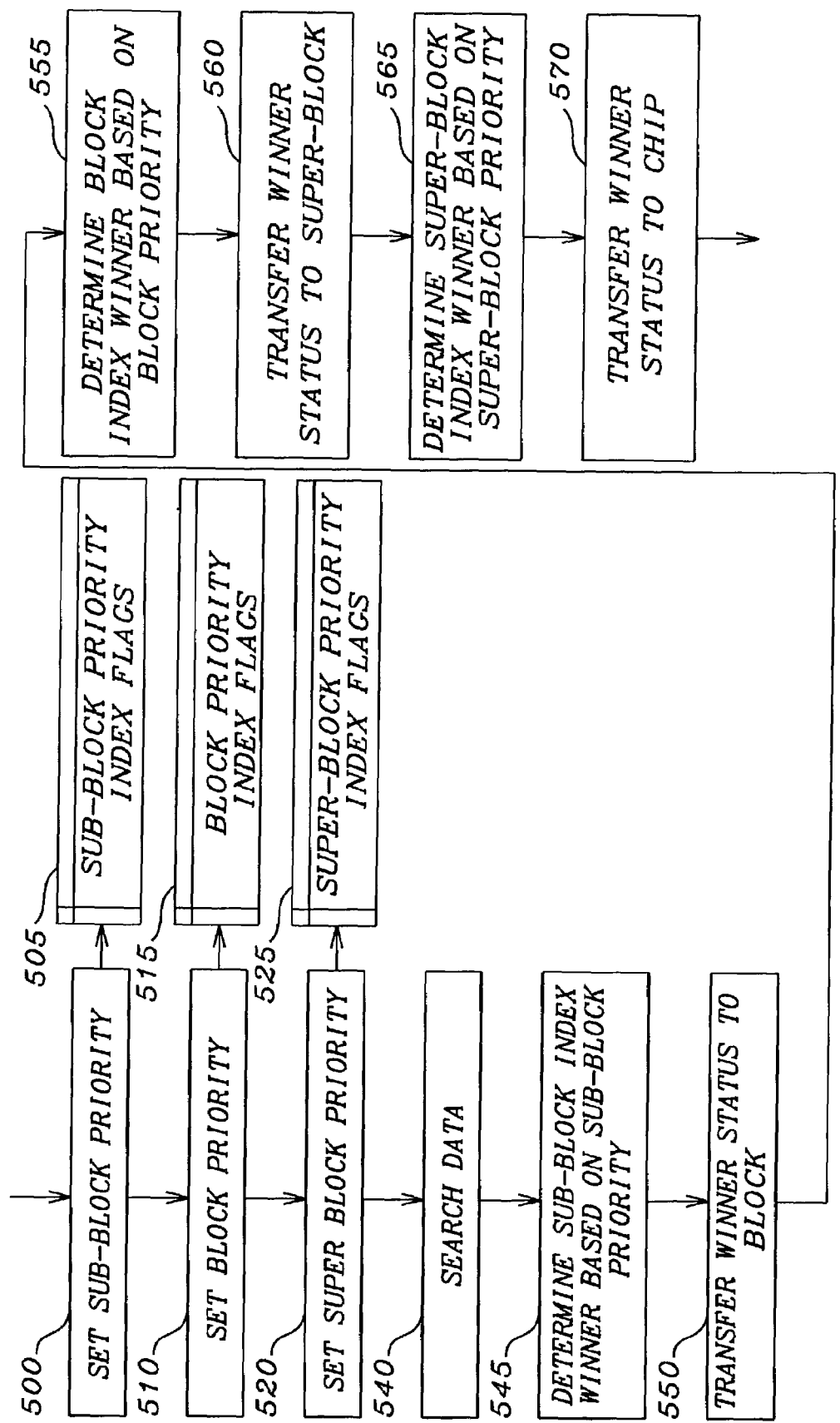
FIG. 5 is a flow diagram of the method for programmably selecting a location or index containing a match of the key value from multiple matches of the key value within a content addressable memory.
Figure 7:
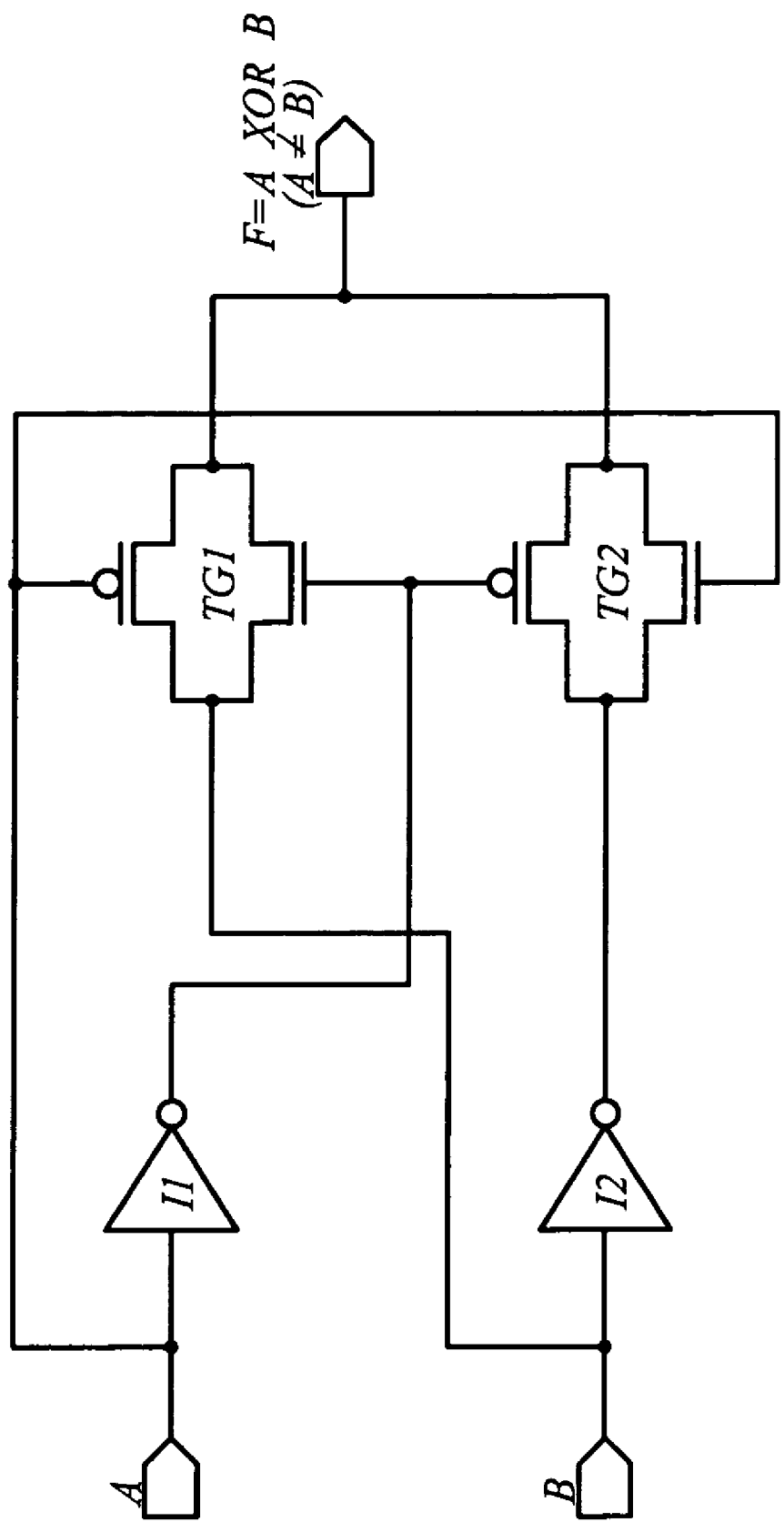
FIG. 7 is a schematic diagram of an inequality or exclusive OR circuit of the conventional art.

FIG. 5 illustrates a method for selecting an index value indicating a location of at least one match of a comparand with contents of a CAM. The priority of the selection of the index value of the CAM allows determination of which of the index values is to be selected, when multiple index values indicate that the comparand is matching multiple locations of the content addressable memory. Conventionally, the priority of a sub-block of a CAM array is fixed and determined by the priority encoder constructed within the CAM array. However, it is keeping with the intent of this invention that the priority of the sub-block be set (Box 500) and the priority of the sub-block established within the priority index flags 505 for the sub-block. As described above, the priority for the sub-block may be provided as a separate programmable command or embedded within the key value with the comparand and separated by control circuitry for placement (Box 500) in the sub-block priority index flags 505. The priority for the block may be similarly set (Box 510) within the block priority index flags 515, and the priority for the super-block may be set (Box 520) within the super-block priority index flags 525. If the sub-block priority is set (Box 500) and the block priority and the super-block priority are not set (Box 510) and (Box 520), the priority setting (Box 510) and (Box 520) is omitted.

The comparand is transferred to each sub-block of the CAM to search (Box 540) for locations where the contents of the CAM match the comparand. If the contents of one or more locations of each sub-block indicate a matching of its contents with the comparand, a plurality index values indicative of each of the locations is activated and input to a priority encoder to select the highest priority sub-block match.

The relative magnitude of the index values within a sub-block is established and, dependent upon the priority value (either fixed or programmable), one of the index values for each sub-block is determined (Box 545) and transferred (Box 550) to the block. At the block level, the relative magnitude of the index values for the block is established and dependent upon the priority value, one of the index values for each block is determined (Box 555) and transferred (Box 560) to the super-block. Finally at the super block level, the relative magnitude of the index values for the super-block is established and dependent upon the priority value, one of the index values for each super-block is determined (Box 565) and transferred (Box 570) to an output terminal.

While this invention has been particularly shown and described with reference to the preferred embodiments thereof, it will be understood by those skilled in the art that various changes in form and details may be made without departing from the spirit and scope of the invention.

The invention claimed is:

1. A magnitude comparator circuit, comprising: a bitwise comparison section that includes two passgates for each bit of two values that are compared to one another, the passgates being enabled according to corresponding bit values of the two values.

2. The magnitude comparator circuit of claim 1, wherein the two values are received from different sub-blocks of a content addressable memory (CAM) device.

3. The magnitude comparator circuit of claim 1, wherein at least a portion of the two values includes changeable priority values.

4. The magnitude comparator circuit of claim 3, wherein the changeable priority values may be set by a user of the CAM device.

5. The magnitude comparator circuit of claim 1, wherein the bitwise comparison section further comprises a first logic circuit to determine the relative magnitude of the bits of the two values and provide a bit magnitude signal indicative of the relative magnitude of the binary values.

6. The magnitude comparator circuit of claim 5 further comprising an equality section in communication with the bitwise comparison section to receive a bit equality signal of each bit of the two values to generate a number equality signal, which when active indicates the equality of the two values.

7. The magnitude comparator circuit of claim 6 further comprising a relative magnitude section in communication with the bit comparison section to receive the bit equality signals and the bit magnitude signals for all bits of the two binary numbers, to logically combine the bit equality signals and the bit magnitude signals to determine the relative magnitude of the two values.

8. The magnitude comparator circuit of claim 1, wherein the bitwise comparison section further comprises a bit complementing circuit for each bit of the two binary numbers to provide a complement for each bit of the two values.

9. A content addressable memory (CAM) device, comprising: a plurality of sub-blocks each sub-block configured to compare a key value to stored data value; and at least one magnitude comparator for selectively providing an output of one of the plurality of sub-blocks according to associated priority values; wherein
the magnitude comparator comprises
a bit comparison circuit that determines equality for each bit of two binary numbers and if not equal, a relative magnitude for each bit of the two binary numbers.

10. The CAM device of claim 9, wherein:
the bit comparison circuit comprises:
two passgates for each bit of the two binary numbers that are compared, the passgates being enabled according to corresponding bit values of the two binary numbers to determine equality of the corresponding bits to generate a bit equality signal for each bit of the two binary numbers, and
a first logic circuit to determine the relative magnitude of the bits of the two binary numbers and provide a bit magnitude signal indicative of the relative magnitude of the binary bits;
an equality determination circuit in communication with the bit comparison circuit to receive the bit equality signal of each bit of the two binary numbers to generate a number equality signal, which, when active, indicates the equality of the two binary numbers; and
a relative magnitude circuit in communication with the bit comparison circuit to receive the bit equality signals and the bit magnitude signals for all bits of the two binary numbers, to logically combine the bit equality signals and the bit magnitude signals to determine the relative magnitude of the two binary numbers.

11. The CAM device of claim 10, wherein the bit comparison circuit further comprises a bit complementer for each bit of the two binary numbers to provide a complement for each bit of the two binary numbers.

12. The CAM device of claim 10, wherein the two binary numbers include locations of stored data values from different sub-blocks corresponding to the key values received by the CAM device.

13. The CAM device of claim 12, wherein at least a portion of the key values includes changeable priority values.

14. The CAM device of claim 13, wherein the changeable priority values may be set by a user of the CAM device.

15. The CAM device of claim 13 further comprising an index selector connected to receive the changeable priority value and the magnitude signal and from the changeable priority signal providing an index signal indicating which one of the binary numbers matches the priority.

16. The CAM device of claim 15 further comprising a multiplexer connected to receive the plurality of input signals and the index signal and dependent upon the index signal provide the output having the one of the plurality of input signals.

17. A method for selecting a result value of a content addressable memory device (CAM), the CAM device having changeable priority values for selecting the result value, the method comprising the steps of:

setting priority values for selecting the result value with a plurality of sub-units of the CAM device;

transferring a comparand to each sub-unit of the CAM device;

comparing the contents of at least one sub-unit of the CAM with the comparand;

providing the result for each of the sub-units;

determining a relative magnitude of the plurality of result values; and dependent upon the priority values, selecting one of the plurality of result values.

18. The method of claim 17, wherein the comparand and the changeable priority values are at least a portion of an external transmitted key value.

19. The method of claim 17, wherein the changeable priority values are set by a user of the content addressable memory device.

20. The method of claim 17, wherein comparing the contents of at least one sub-unit of the CAM with the comparand comprises the step of the bitwise comparing of the contents of the sub-unit of the CAM with the comparand the bitwise comparing including the step of bitwise complementing for each bit the contents of the sub-unit of the CAM and the comparand to provide a complement for each bit of the contents of the sub-unit of the CAM and the comparand.

* * * * *

UNITED STATES PATENT AND TRADEMARK OFFICE
CERTIFICATE OF CORRECTION

PATENT NO.       : 7,403,407 B1
APPLICATION NO.  : 10/266953
DATED            : July 22, 2008
INVENTOR(S)      : Sanjay M. Wanzakhade It is certified that error appears in the above-identified patent and that said Letters Patent is hereby corrected as shown below:

At column 3, line 47, please replace "objects'" with -- objects -- so that the corresponding phrase reads -- at least one of these objects --.

At column 4, line 24, please replace "pass-gates" with -- passgates -- so that the corresponding phrase reads -- the two passgates --.

At column 5, line 9, please replace "1001n" with -- 100n -- so that the corresponding phrase reads -- CAM cells 100a, . . . , 100n --.

At column 5, line 10, please replace "I10a, . . . , I10n" with -- 110a, . . . , 110n -- so that the corresponding phrase reads -- super-blocks 110a, . . . , 110n --.

At column 5, line 16, please replace "I10a, . . . , I10n" with -- 110a, . . . , 110n -- so that the corresponding phrase reads -- super-block 110a, . . . , 110n --.

At column 5, line 18, please replace "I10a, . . . , I10n" with -- 110a, . . . , 110n -- so that the corresponding phrase reads -- super-block 110a, . . . , 110n --.

At column 5, lines 20-21, please replace "I15a, . . . , I15n, I20a, . . . , I20n, I25a, . . . , I25n, I30a, . . . , I30n, I35" with -- 115a, . . . , 115n, 120a, . . . , 120n, 125a, . . . , 125n, 130a, . . . , 130n, 135 -- so that the corresponding phrase reads -- multiplexing circuit I15a, . . . , I15n, I20a, . . . , I20n, I25a, . . . , I25n, I30a, . . . , I30n --.

At column 5, line 42, please replace "I15a, . . . , I15n" with -- 115a, . . . , 115n -- so that the corresponding phrase reads -- multiplexing circuits 115a, . . . , 115n --.

At column 5, line 44, please replace "100a, 100n" with -- 100a, . . . , 100n -- so that the corresponding phrase reads -- sub-blocks 100a, . . . , 100n --.

At column 5, line 45, please replace "I20a, . . . , I20n" with -- 120a, . . . , 120n -- so that the corresponding phrase reads -- multiplexing circuit 120a, . . . , 120n --.

UNITED STATES PATENT AND TRADEMARK OFFICE
CERTIFICATE OF CORRECTION

PATENT NO.       : 7,403,407 B1
APPLICATION NO.  : 10/266953
DATED            : July 22, 2008
INVENTOR(S)      : Sanjay M. Wanzakhade It is certified that error appears in the above-identified patent and that said Letters Patent is hereby corrected as shown below:

At column 5, lines 46-47, please replace "I20a, . . . , I20n" with -- 120a, . . . , 120n -- so that the corresponding phrase reads -- multiplexing circuit 120a, . . . , 120n --.

At column 5, line 49, please replace "I20a, . . . , I20n" with -- 120a, . . . , 120n -- so that the corresponding phrase reads -- multiplexing circuit 120a, . . . , 120n --.

At column 5, line 52, please replace "I15a, . . . , I15n" with -- 115a, . . . , 115n -- so that the corresponding phrase reads -- multiplexing circuits 115a, . . . , 115n --.

At column 5, line 55, please replace "I20a, . . . , I20n" with -- 120a, . . . , 120n -- so that the corresponding phrase reads -- multiplexing circuits 120a, . . . , 120n --.

At column 5, line 56, please replace "I25a, . . . , I25n" with -- 125a, . . . , 125n -- so that the corresponding phrase reads -- multiplexing circuit 125a, . . . , 125n --.

At column 5, lines 57-58, please replace "I10a, I00n" with -- 110a, . . . , 100n -- so that the corresponding phrase reads -- super blocks 110a, . . . , 100n --.

At column 5, line 59, please replace "I10a, . . . , I10n" with -- 110a, . . . , 100n -- so that the corresponding phrase reads -- super block 110a, . . . , 110n --.

At column 5, line 60, please replace "I30a, . . . , I30n, and I35" with -- 130a, . . . , 130n, and 135 -- so that the corresponding phrase reads -- multiplexing circuits 130a, . . . , 130n, and 135 --.

UNITED STATES PATENT AND TRADEMARK OFFICE
CERTIFICATE OF CORRECTION

PATENT NO. : 7,403,407 B1
APPLICATION NO. : 10/266953
DATED : July 22, 2008
INVENTOR(S) : Sanjay M. Wanzakhade It is certified that error appears in the above-identified patent and that said Letters Patent is hereby corrected as shown below:

At column 5, lines 66-67, please replace "I15a, . . . , I15n, I20a, I20n, I25a, . . . , I25n, I30a, . . . , I30n, I35" with -- 115a, . . . , 115n, 120a, . . . , 120n, 125a, . . . , 125n, 130a, . . . , 130n, 135 -- so that the corresponding phrase reads -- multiplexing circuits 115a, . . . , 115n, 120a, . . . , 120n, 125a, . . . , 125n, 130a, . . . , 130n, 135 --.

Signed and Sealed this

Eighteenth Day of November, 2008

JON W. DUDAS
*Director of the United States Patent and Trademark Office*